United States Patent
Han et al.

(10) Patent No.: US 9,684,340 B2
(45) Date of Patent: Jun. 20, 2017

(54) ROLLABLE FLEXIBLE DISPLAY DEVICE

(71) Applicant: LG DISPLAY CO., LTD., Seoul (KR)

(72) Inventors: Changhoon Han, Paju-si (KR); Bongchul Kim, Daegu (KR); Jaehyun Kim, Paju-si (KR); Yongyub Kim, Goyang-si (KR); Jaewook Park, Daegu (KR); Woosub Kim, Seongnam-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/981,225

(22) Filed: Dec. 28, 2015

(65) Prior Publication Data

US 2017/0031388 A1     Feb. 2, 2017

(30) Foreign Application Priority Data

Jul. 30, 2015 (KR) .................. 10-2015-0108077

(51) Int. Cl.
*G06F 1/16* (2006.01)

(52) U.S. Cl.
CPC .................. *G06F 1/1652* (2013.01)

(58) Field of Classification Search
CPC .................................................. G06F 1/1652
USPC ........................................ 361/679.26, 679.27
See application file for complete search history.

(56) References Cited

U.S. PATENT DOCUMENTS

| | | | | |
|---|---|---|---|---|
| 7,463,238 B2* | 12/2008 | Funkhouser | .......... | G06F 1/1601 345/107 |
| 2003/0048256 A1* | 3/2003 | Salmon | .......... | G06F 1/1613 345/168 |
| 2005/0040962 A1* | 2/2005 | Funkhouser | .......... | G06F 1/1601 340/815.4 |
| 2006/0209218 A1* | 9/2006 | Lee | .......... | G04G 9/00 349/1 |
| 2012/0170244 A1* | 7/2012 | Kwon | .......... | G06F 1/1637 361/829 |
| 2014/0267949 A1* | 9/2014 | Kim | .......... | G06F 3/041 349/12 |
| 2014/0362512 A1* | 12/2014 | Hinson | .......... | G06F 15/025 361/679.21 |
| 2015/0220118 A1* | 8/2015 | Kwak | .......... | G06F 3/14 345/667 |
| 2016/0029474 A1* | 1/2016 | Cho | .......... | H05K 1/028 361/749 |
| 2016/0035978 A1* | 2/2016 | Lin | .......... | H01L 51/0017 257/88 |
| 2016/0191690 A1* | 6/2016 | Park | .......... | H04M 1/72519 455/566 |
| 2016/0224067 A1* | 8/2016 | Meng | .......... | G06F 1/1652 |

FOREIGN PATENT DOCUMENTS

NL    WO 2007072234 A1 *    6/2007    .......... G06F 1/1615

* cited by examiner

*Primary Examiner* — Nidhi Thaker
(74) *Attorney, Agent, or Firm* — Dentons US LLP

(57) ABSTRACT

Disclosed is a rollable flexible display device. The rollable flexible display device includes, for example, a display panel, a source board, and a panel roller unit. The panel roller unit provides a mechanical structure for rolling the display panel and the source board along an outer circumferential surface thereof. The panel roller unit may have a region forming a curved surface and a region forming a planar surface.

17 Claims, 18 Drawing Sheets

(a)

(b)

Unrollable region 140

ROLLABLE FLEXIBLE DISPLAY DEVICE

This application claims the benefit of Korean Patent Application No. 10-2015-0108077, filed on Jul. 30, 2015, which is incorporated herein by reference for all purposes as if fully set forth herein.

BACKGROUND OF THE INVENTION

Field of the Invention

The present invention relates to a display device and a method of manufacturing the same. More particularly, the present invention relates to a rollable flexible display device with improved mechanical strength.

Discussion of the Related Art

With the advancement of information technology, the market for display devices has grown as a medium of connecting users and information. In line with this trend, the use of display devices such as organic light emitting display (OLED) devices, liquid crystal display (LCD) devices, and plasma display panel (PDP) devices has increased.

An OLED device includes a display panel including a plurality of sub-pixels and a driver for driving the display panel. The driver typically includes a scan driver for supplying a scan signal (or a gate signal) to the display panel and a data driver for supplying a data signal to the display panel.

An OLED device can be manufactured in a flexible manner so that the display panel thereof can be variously deformed, such as being bent or curved and further, being rolled in a roller form and subsequently unrolled. There have been recently increasing attempts to design a display panel of an OLED device as well as a mechanical structure for accommodating the display panel in various ways.

SUMMARY OF THE INVENTION

Accordingly, the present invention is directed to a display device and a method of manufacturing the same that substantially obviate one or more problems due to limitations and disadvantages of the related art.

An advantage of the present invention is to provide a rollable flexible display device with improved mechanical strength.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a rollable flexible display device may, for example, include a display panel configured to display an image; a source board connected to the display panel and allowing a driver for providing a signal to the display panel to be mounted thereon; and a panel roller unit configured to provide a mechanical structure for rolling the display panel and the source board along an outer circumferential surface thereof, wherein the panel roller unit has a region forming a curved surface and a region forming a planar surface.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

A rollable flexible display device according to an embodiment of the present invention will be described with an organic light emitting display (OLED) device by way of example. However, a display panel for implementing a rollable flexible display device according to an embodiment of the present invention is not limited thereto.

Figure 1:
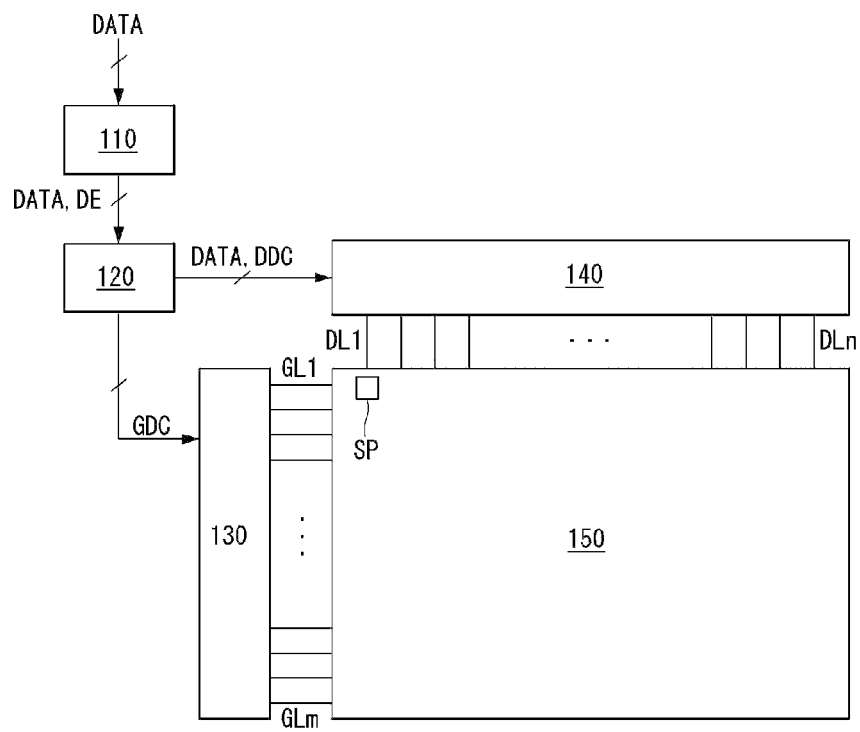
FIG. 1 is a schematic block diagram of an organic light emitting display device according to an embodiment of the present disclosure.
Figure 2:
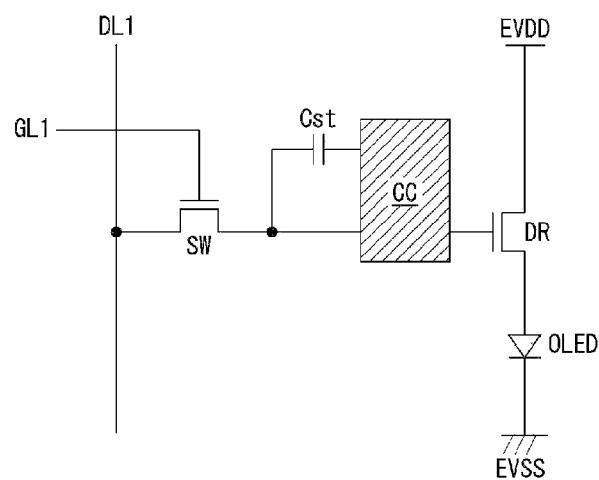
FIG. 2 is a schematic circuit diagram of a sub-pixel of the organic light emitting display device in FIG. 1.
Figure 3:
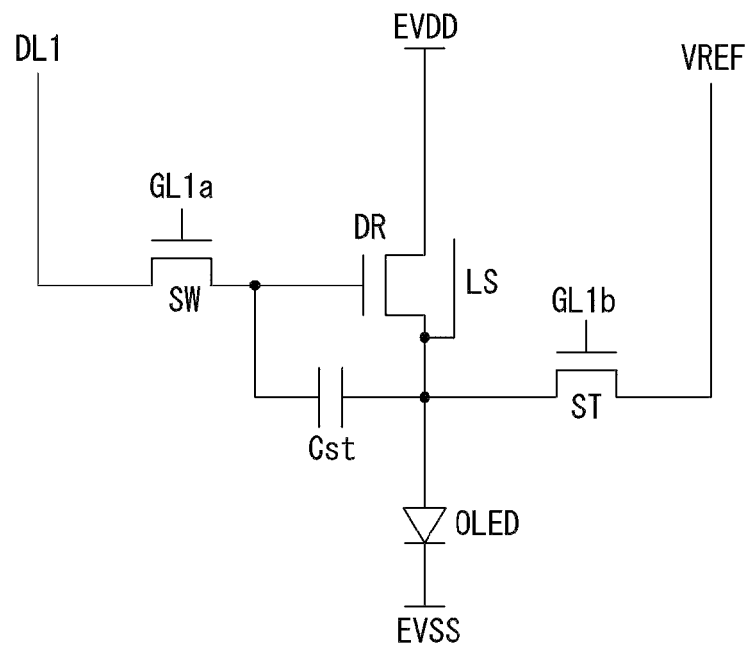
FIG. 3 is a view illustrating a configuration of a sub-pixel according to an embodiment of the present disclosure.

FIG. 1 is a schematic block diagram of an OLED device according to an embodiment of the present disclosure, FIG. 2 is a schematic circuit diagram of a sub-pixel, and FIG. 3 is a view illustrating a configuration of a sub-pixel according to an embodiment of the present disclosure.

As illustrated in FIG. 1, an OLED device according to an embodiment of the present disclosure includes an image processing unit 110, a timing controller 120, a data driver 140, a scan driver 130, and a display panel 150.

The image processing unit 110 outputs a data enable signal DE together with an image data signal supplied from the outside. In addition to the data enable signal DE, the image processing unit 110 may output one or more of a vertical synchronization signal, a horizontal synchronization signal and a clock signal.

The timing controller 120 receives the data enable signal DE or a driving signal including a vertical synchronization signal, a horizontal synchronization signal, and a clock signal, and the image data signal. The timing controller 120 outputs a gate timing control signal GDC for controlling an operation timing of the scan driver 130 and a data timing control signal DDC for controlling an operation timing of the data driver 140 on a basis of the driving signal.

In response to the data timing control signal DDC supplied from the timing controller 120, the data driver 140 samples and latches the image data signal supplied from the timing controller 120, converts the latched signal into a data signal DATA using gamma reference voltages, and outputs the same. The data driver 140 outputs the data signal DATA through data lines DL1 to DLn. The data driver 140 may be provided in the form of an integrated circuit (IC).

In response to the gate timing control signal GDC supplied from the timing controller 120, the scan driver 130 outputs a scan signal, while shifting a level of a gate voltage. The scan driver 130 outputs the scan signal through scan line GL1 to GLm. The scan driver 130 may be formed in the form of an integrated circuit (IC) or in a gate-in-panel manner on the display panel 150.

In response to the data signal DATA and the scan signal respectively supplied from the data driver 140 and the scan driver 130, the display panel 150 displays an image. The display panel 150 includes sub-pixels SP operating to display an image.

The sub-pixels can be formed according to a top-emission scheme, a bottom-emission scheme, or a dual-emission scheme. The sub-pixels SP includes a red sub-pixel, a green sub-pixel, and a blue sub-pixel, or include a white sub-pixel, a red sub-pixel, a green sub-pixel, and a blue sub-pixel. The sub-pixels SP may have one or more different emission areas according to their emission characteristics.

As illustrated in FIG. 2, one sub-pixel includes a switching transistor SW, a driving transistor DR, a capacitor Cst, a compensation circuit CC, and an organic light emitting diode OLED.

The switching transistor SW performs a switching operation such that a data signal DATA supplied through the first data line DL1 in response to a scan signal supplied through the first scan line GL1 is stored as a data voltage in the capacitor Cst. The driving transistor DR operates such that a driving current flows between a first power line EVDD and a second power line EVSS according to the data voltage stored in the capacitor Cst. The OLED emits light according to an amount of driving current formed by the driving transistor TR.

The compensation circuit CC is a circuit added to the sub-pixel to compensate for a threshold voltage of the driving transistor DR. The compensation circuit CC includes one or more transistors. The compensation circuit CC may be variously configured depending on compensation methods, which will now be described.

As illustrated in FIG. 3, the compensation circuit CC includes a sensing transistor ST and a sensing line VREF. The sensing transistor ST is connected between a source line of the driving transistor DR and an anode electrode (or a sensing node) of the OLED. The sensing transistor ST operates to supply an initialization voltage (or a sensing voltage) transferred through the sensing line VREF to the sensing node or sense a voltage or current of the sensing node.

A first electrode of the switching transistor SW is connected to the first data line DL, and a second electrode thereof is connected to a gate electrode of the driving transistor DR. A first electrode of the driving transistor DR is connected to the first power line EVDD and a second electrode thereof is connected to the anode electrode of the OLED. A first electrode of the capacitor Cst is connected to the gate electrode of the driving transistor DR, and a second electrode thereof is connected to the anode electrode of the OLED. The anode electrode of the OLED is connected to the second electrode of the driving transistor DR, and a cathode electrode thereof is connected to the second power line EVSS. A first electrode of the sensing transistor ST is connected to the sensing line VREF and a second electrode thereof is connected to the anode electrode, the sensing node, of the OLED. For reference, the first electrode and the second electrode are defined as a source electrode and a drain electrode or a drain electrode and a source electrode depending on transistor types.

An operation time of the sensing transistor ST may be similar to, the same as, or different to that of the switching transistor SW depending on compensation algorithms (or configurations of the compensation circuit). For example, a gate electrode of the switching transistor SW may be connected to a 1a scan line GL1a, and a gate electrode of the sensing transistor ST may be connected to a 1b scan line GL1b. In another example, the 1a scan line connected to the gate electrode of the switching transistor SW and the 1b scan line GL1b connected to the gate electrode of the sensing transistor ST may be connected to be commonly shared.

The sensing line VREF may be connected to a data driver. In this case, the data driver may sense the sensing node of the sub-pixel during a non-display period or an N frame (N is an integer equal to or greater than 1) of an image and perform a compensation driving according to the sensing result in real time. Meanwhile, the switching transistor SW and the sensing transistor ST may be turned on at the same time. In this case, a sensing operation through the sensing line VREF and a data output operation of outputting a data signal may be separated (differentiated) on a basis of a time-division scheme of the data driver.

A compensation target according to the sensing result may be a data signal in a digital form, a data signal in an analog form, or a gamma voltage. The compensation circuit, which generates a compensation signal (or compensation voltage) on a basis of the sensing result, may be implemented as an internal circuit of the data driver, as an internal circuit of the timing controller, or as a separate circuit.

FIG. 3 illustrates a sub-pixel having a 3-transistor/1-capacitor structure including the switching transistor SW, the driving transistor DR, the capacitor Cst, the OLED and the sensing transistor ST by way of example. However, when a compensation circuit is added thereto, the sub-pixel may be configured to have a 3T2C, 4T2C, 5T1C, or 6T2C structure.

The OLED device described above does not require a backlight unit, and thus, the OLED device may be manufactured to have a thin profile compared with a liquid crystal display (LCD). Also, as a thickness of the OLED device is reduced, the OLED device can be so flexible that the display panel may be deformed such as being rolled and subsequently unrolled in a roller form, as well as being bent or curved.

Hereinafter, a structure of a display panel, which is rollable and subsequently unrollable in a roller form, to implement a rollable flexible display device will be described.

Figure 4:
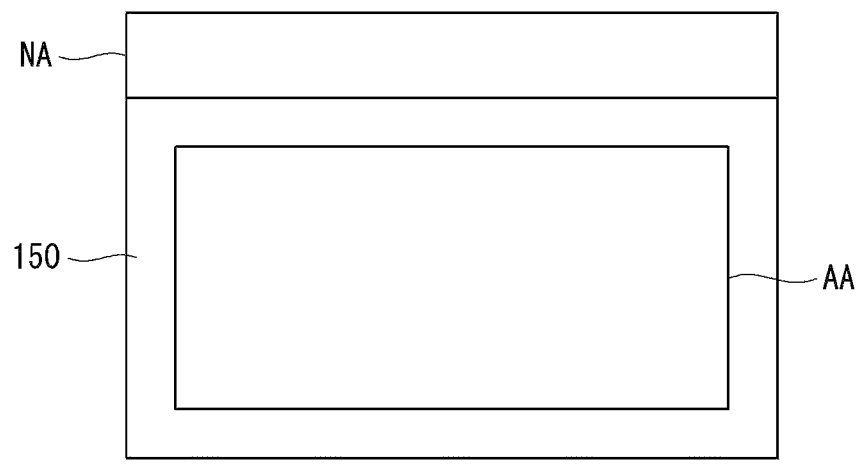
FIG. 4 is a plan view of a display panel according to an embodiment of the present disclosure.
Figure 5:
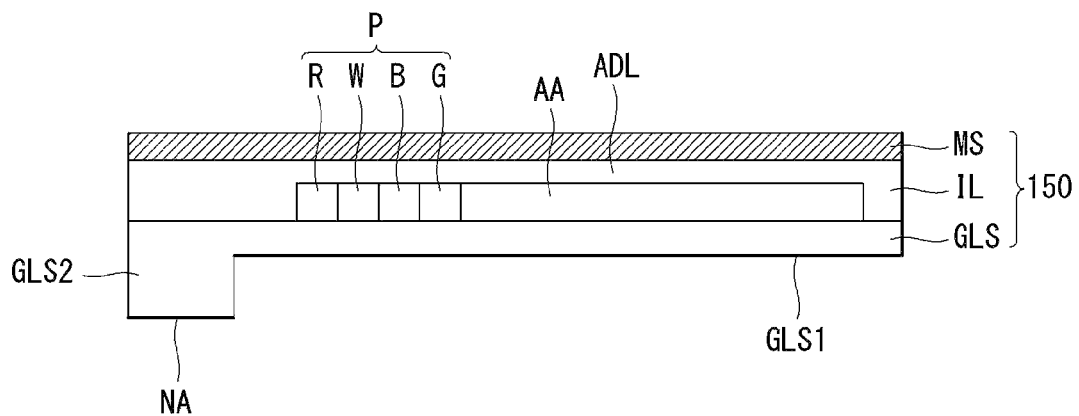
FIG. 5 is a cross-sectional view of a display panel according to an embodiment of the present disclosure.
Figure 6:
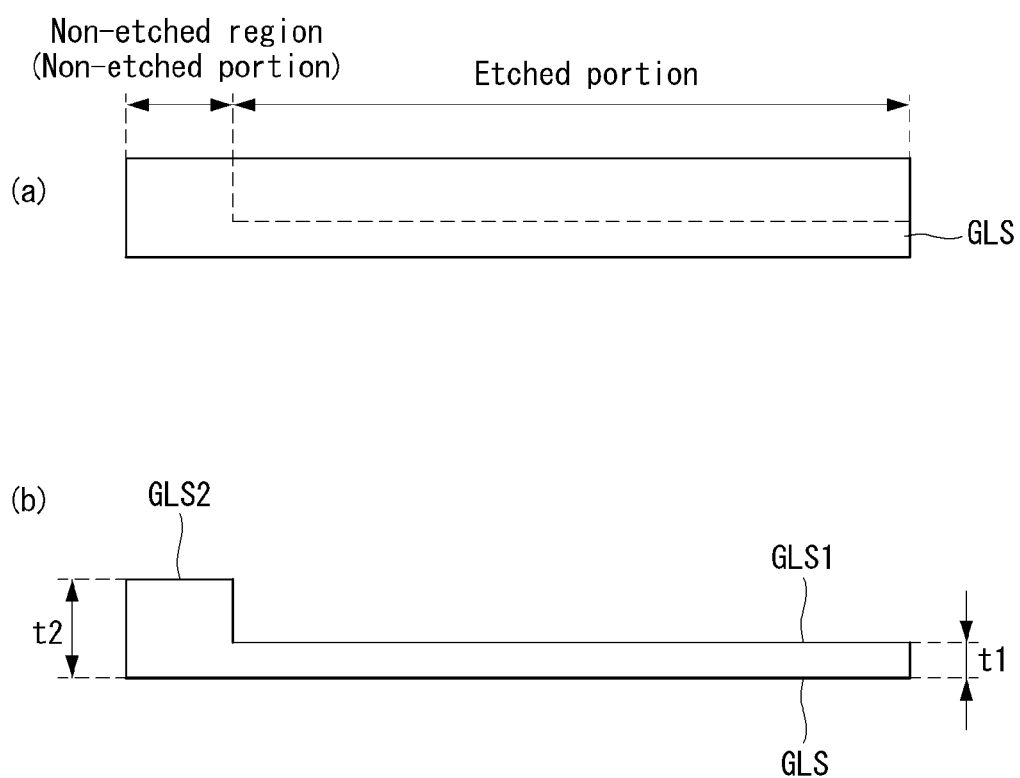
FIG. 6 is a cross-sectional view illustrating an example of etching of a first substrate.
Figure 7:
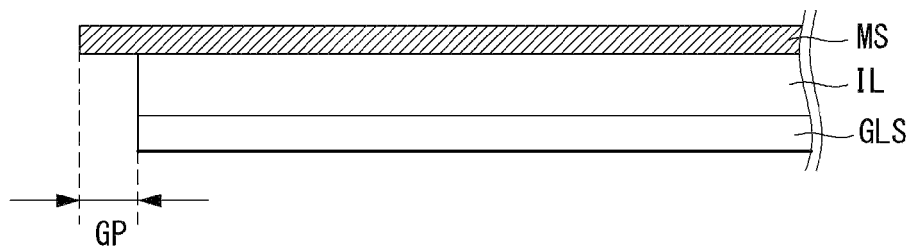
FIG. 7 is a cross-sectional view illustrating an example of attaching a first substrate and a second substrate.
Figure 8:
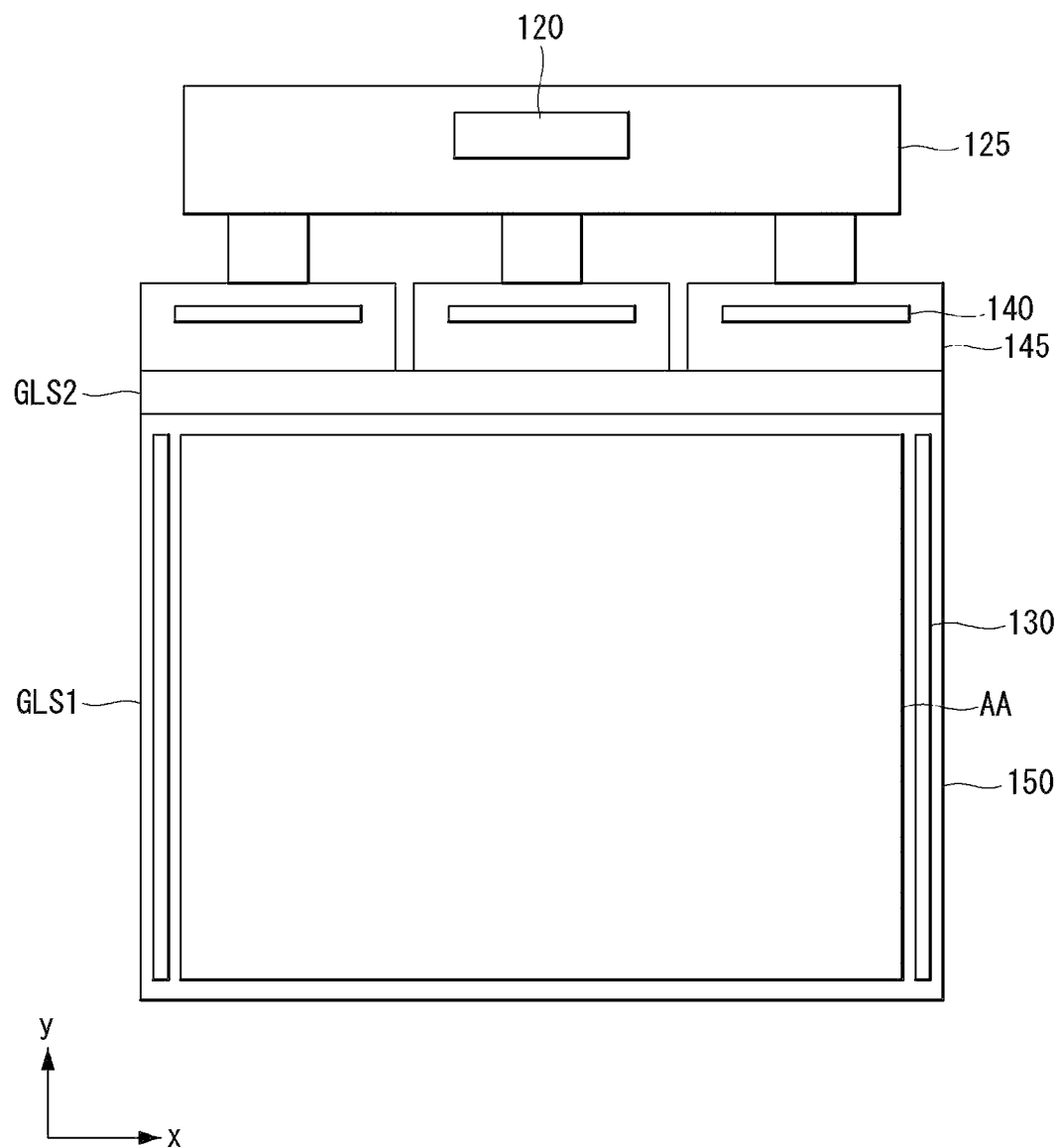
FIG. 8 is a plan view illustrating a modularized display panel.

FIG. 4 is a plan view of a display panel according to an embodiment of the present disclosure, FIG. 5 is a cross-sectional view of a display panel according to an embodiment of the present disclosure, FIG. 6 is a cross-sectional view illustrating an example of etching of a first substrate, FIG. 7 is a cross-sectional view illustrating an example of attaching a first substrate and a second substrate, and FIG. 8 is a plan view illustrating a modularized display panel.

As illustrated in FIGS. 4 through 8, a display panel 150 according to an embodiment of the present disclosure includes a first substrate GLS an intermediate layer IL having a display area AA including a plurality of pixels P, and a second substrate MS.

The intermediate layer IL has an adhesive layer ADL in addition to the plurality of pixels P constituting the display area AA. The plurality of pixels P may include sub-pixels emitting red (R), white (W), blue (B), and green (G) light, but the present disclosure is not limited thereto. The adhesive layer ADL is formed of an adhesive material for bonding the first substrate GLS and the second substrate MS and sealing the intermediate layer IL positioned between the first substrate GLS and the second substrate MS.

The first substrate GLS is formed of glass or resin. The first substrate GLS may selectively have a thickness ranging from 0.01 mm to 0.2 mm. Experiment results show that when the first substrate GLS is as thin as having a thickness ranging from 0.01 mm to 0.1 mm, it may be easily deformed and rollable and subsequently unrollable in a roller form even when the first substrate GLS is formed of glass, rather than a resin.

The first substrate GLS has an etched region (etched portion) GLS1 and a non-etched region (non-etched portion) GLS2. The non-etched region GLS2 is formed in a pad region for a connection to an external board. The non-etched region GLS2 has a rectangular shape with its width direction being longer. The non-etched region GLS2 is provided to increase rigidity of the pad region connected to an external board. On this account, preferably, the non-etched region GLS2 accounts for 5% to 10% of an entire area of the first substrate GLS, and a thickness t2 of the non-etched region GLS2 selectively ranges from 0.1 mm to 0.2 mm.

An etching process is performed on the first substrate GLS except the non-etched region GLS2 to form the etched region GLS1. The etched region GLS1 is provided to alleviate generation of tensile stress that may act on the first substrate GLS when the display panel 15 is rolled and subsequently unrolled. On this account, preferably, a thickness t1 of the etched region GLS selectively ranges from 0.01 mm to 0.1 mm.

The second substrate MSS is formed of a metal. A thickness of the second substrate MS may selectively range from 0.01 mm to 0.2 mm. The second substrate MS serves to absorb, disperse, and alleviate a tensile stress that may act on the first substrate GLS when the display panel 150 is rolled and subsequently unrolled. Experiment results show that when the thickness of the second substrate MS is as thin as having a thickness ranging from 0.01 mm to 0.2 mm, the tensile stress that may act on the first substrate GLS when the display panel 150 is rolled and subsequently unrolled may be effectively absorbed, dispersed, and alleviated.

Since the second substrate MS is formed of a metal, the second substrate MS has a high resistivity to impact, compared with the first substrate GLS. Thus, the second substrate MS may be manufactured to be greater than the first substrate GLS. That is, the second substrate MS may have a protrusion GP protruding outwardly compared with the first substrate GLS, and one or more protrusions may be provided. The protrusion GP of the second substrate MS may serve to protect a portion of the corner that is prone to impact, or the like.

The display panel 150 may be electrically connected to the timing controller 120, the data driver 140, and the scan driver 130 (the image processing unit and the power supply unit are not shown) so as to be modularized, as illustrated in FIG. 8.

Referring to FIG. 8, the scan driver 130 is formed on the display panel 150 in a gate-in-panel manner, the data driver 140 is mounted on a source board 145, and the timing controller 120 is mounted on a control board 125.

In order to manufacture the display panel 150 in a roller form, the scan driver 130 is beneficially formed in the gate-in-panel manner on the left or right, or on both the left and right sides of the display area AA, but the present disclosure is not limited thereto. Also, the data driver 140 is mounted on the source board 145 formed as a flexible circuit board, while the timing controller 120, or the like, may be mounted on the control board 125 formed as a printed circuit board (PCB), but the present disclosure is not limited thereto. The source board 145 and the control board 125 may be connected by a cable 123, but the present disclosure is not limited thereto.

Hereinafter, a structure of a mechanical structure for implementing a rollable flexible display device will be described.

Figure 9:
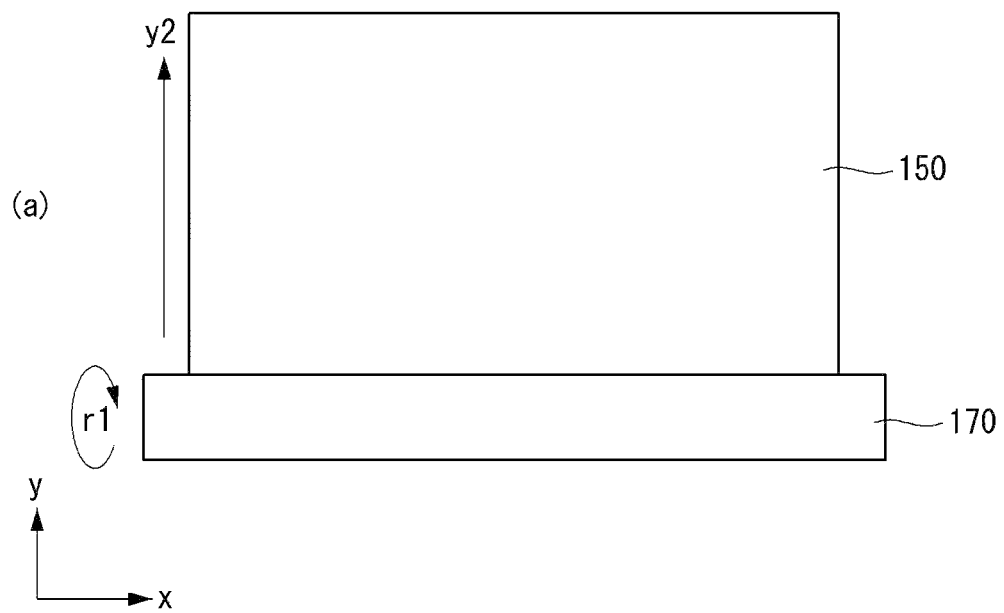
FIG. 9 is a view illustrating a rollable flexible display device according to an embodiment of the present disclosure.
Figure 9:
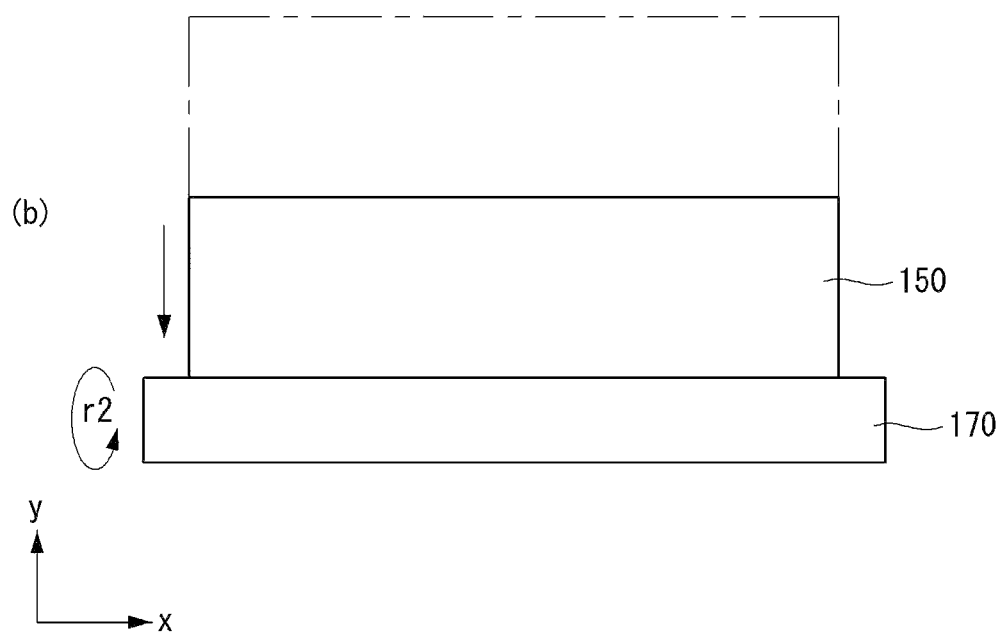
Figure 10:
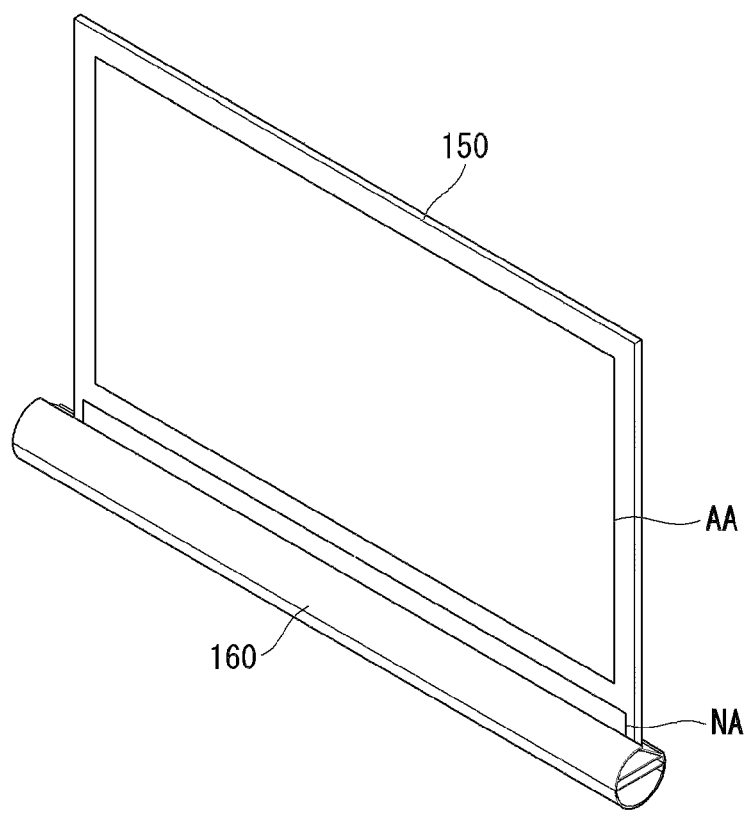
FIG. 10 is a perspective view illustrating a display panel and a panel roller unit.

FIG. 9 is a view illustrating a rollable flexible display device according to an embodiment of the present disclosure, and FIG. 10 is a perspective view illustrating a display panel and a panel roller unit.

As illustrated in FIGS. 9 and 10, a rollable flexible display device according to an embodiment of the present disclosure includes a modularized display panel 150 (hereinafter, referred to simply as a "display panel"), a panel roller unit 160, and a receiving unit 170.

The panel roller unit 160 has a circular shape. The panel roller unit 160 provides a mechanical structure for allowing the display panel 150 to be wound around an outer circumferential surface thereof and subsequently unwound therefrom. The panel roller unit 160 is received by the receiving unit 170.

The receiving unit 170 receives the display panel 15 and the panel roller unit 160. The receiving unit 170 may include a driving device, for example, a motor, a gear, and a power source therein in order to rotate the panel roller unit 160 electrically. Thus, the receiving unit 170 may be designed to have a circular, oval, quadrangular, rectangular, or polygonal shape according to configurations or designs of the driving device.

The display panel 150 may be led out of the receiving unit 170 or led into the receiving unit 170 according to rotation directions of the driving device. For example, when the driving device rotates in an r1 direction, the panel roller unit 160 may unroll the display panel 150. In this case, the display panel 150 may be moved in a y2 direction so as to be led out of the receiving unit 170. Conversely, when the driving device rotates in an r2 direction, the panel roller unit 160 may roll the display panel 150. In this case, the display panel 150 may be in a y1 direction so as to be led into the receiving unit 170.

Figure 11:
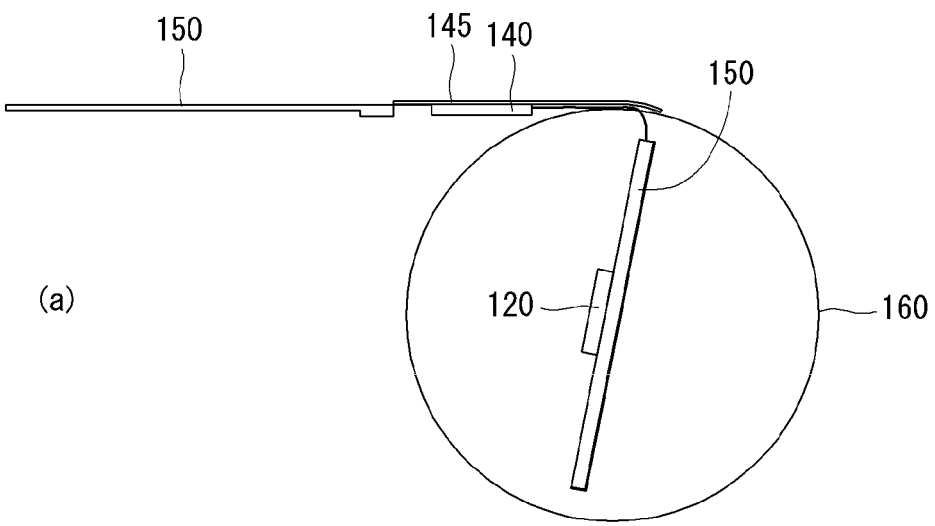
FIG. 11 is a cross-sectional view illustrating a problem of a rollable flexible display device according to an experimental example.
Figure 11:
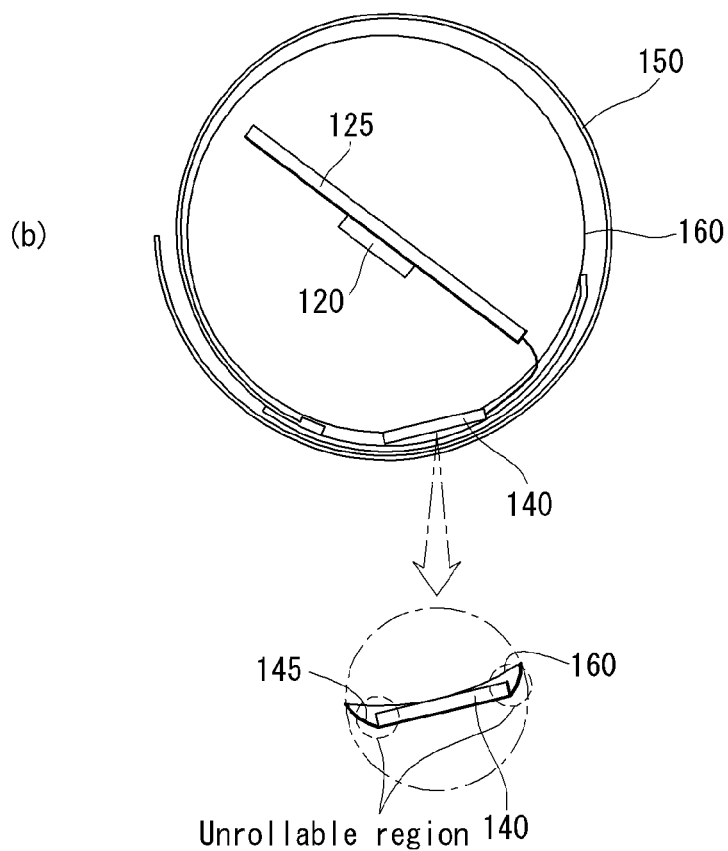
Figure 12:
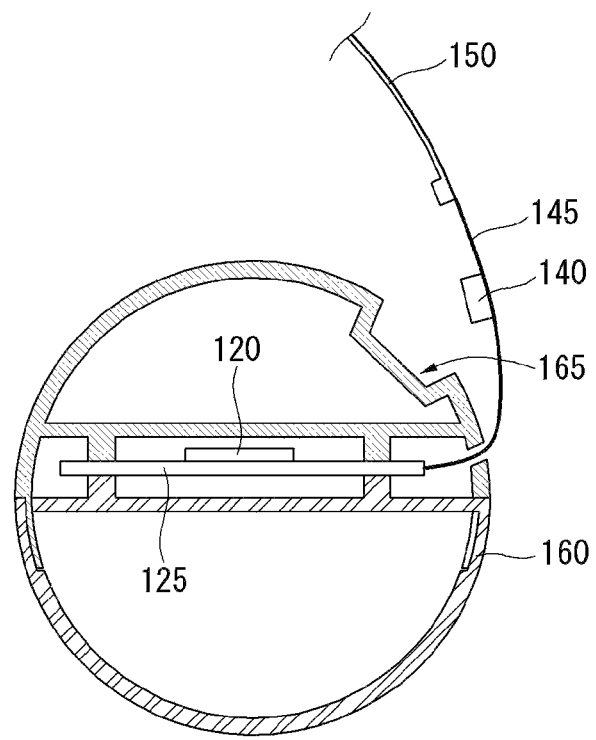
FIGS. 12 through 14 are cross-sectional views illustrating a rollable flexible display device according to the first embodiment of the present disclosure.
Figure 13:
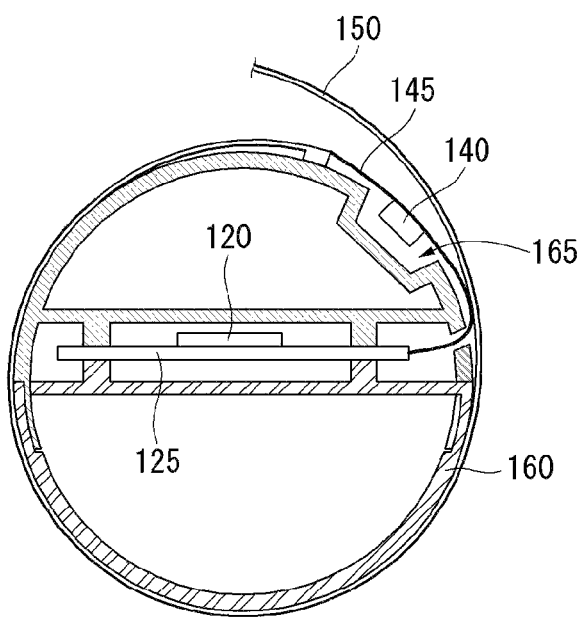
Figure 14:
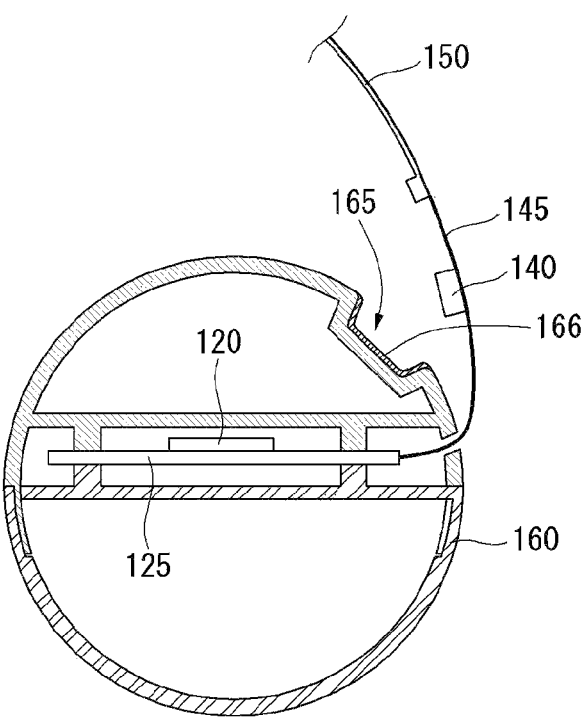
Figure 15:
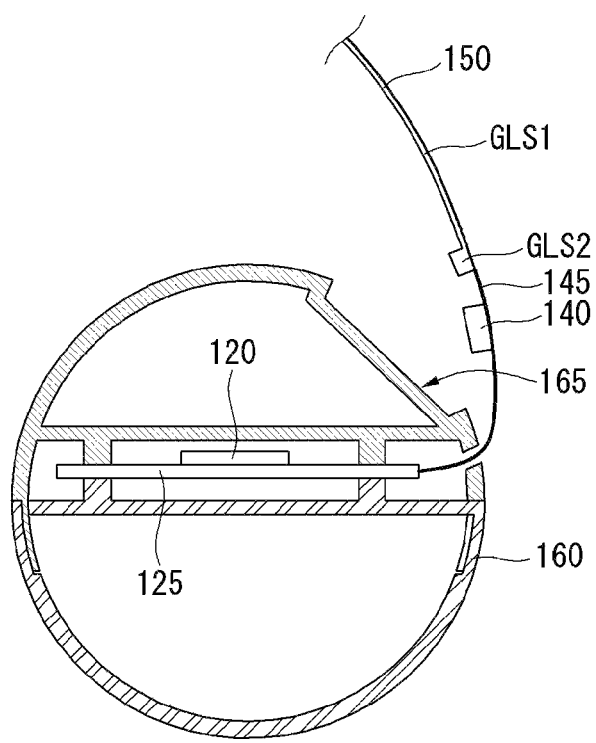
FIGS. 15 through 17 are cross-sectional views illustrating a rollable flexible display device according to the second embodiment of the present disclosure.
Figure 16:
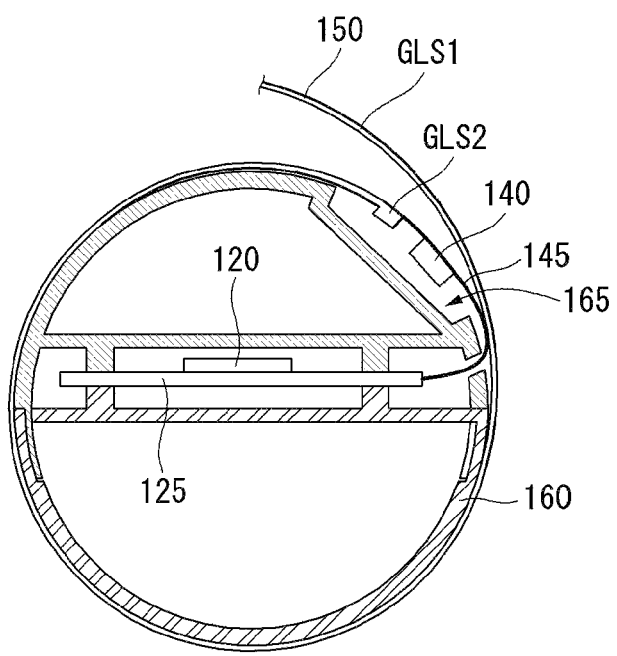
Figure 17:
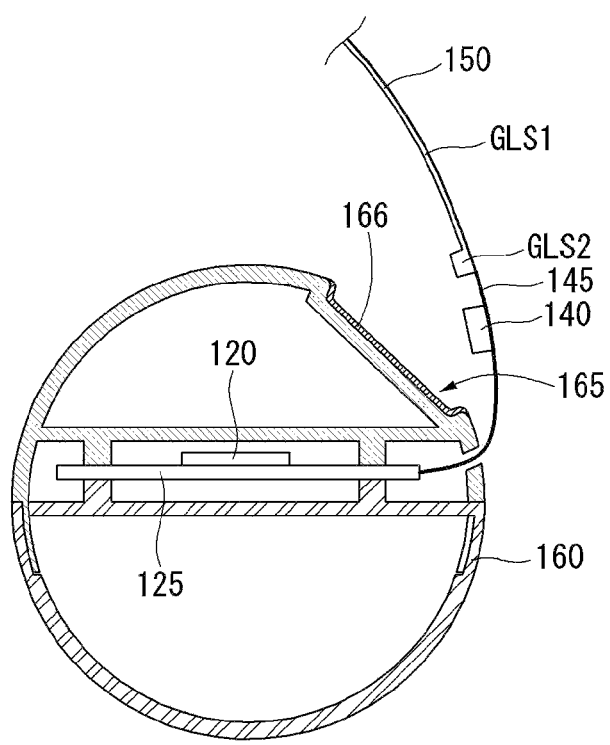
Figure 18:
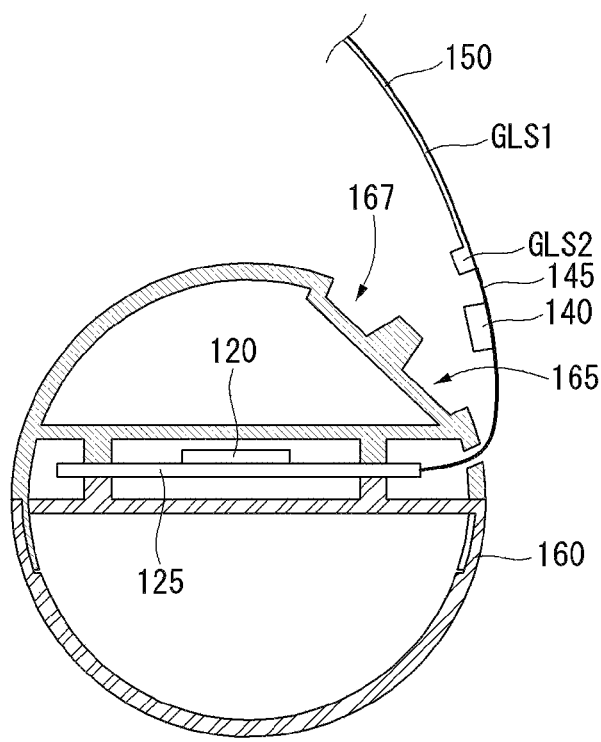
FIGS. 18 through 20 are cross-sectional views illustrating a rollable flexible display device according to the third embodiment of the present disclosure.
Figure 19:
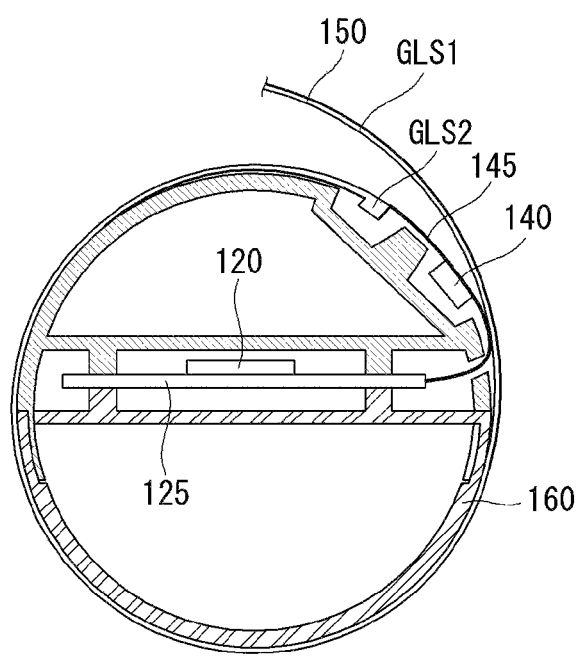
Figure 20:
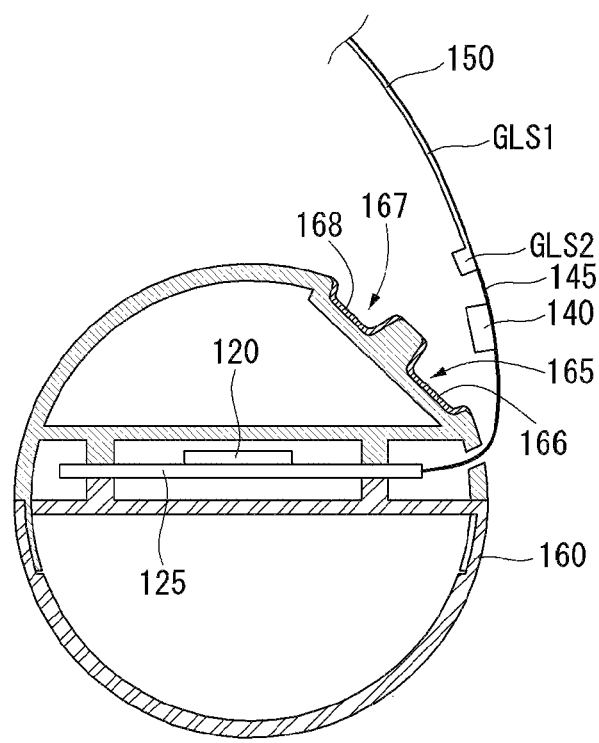
Figure 21:
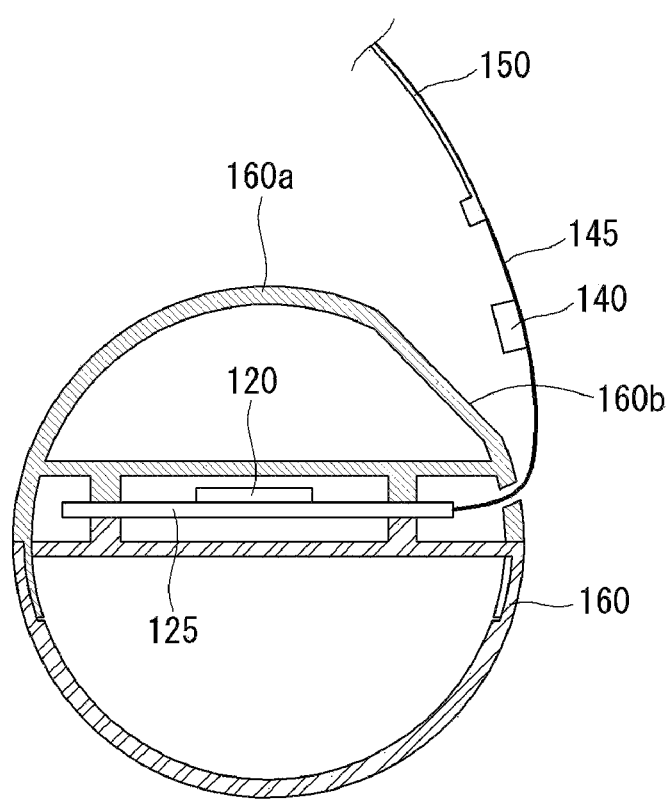
FIG. 21 is a cross-sectional view illustrating a rollable flexible display device according to the fourth embodiment of the present disclosure.
Figure 22:
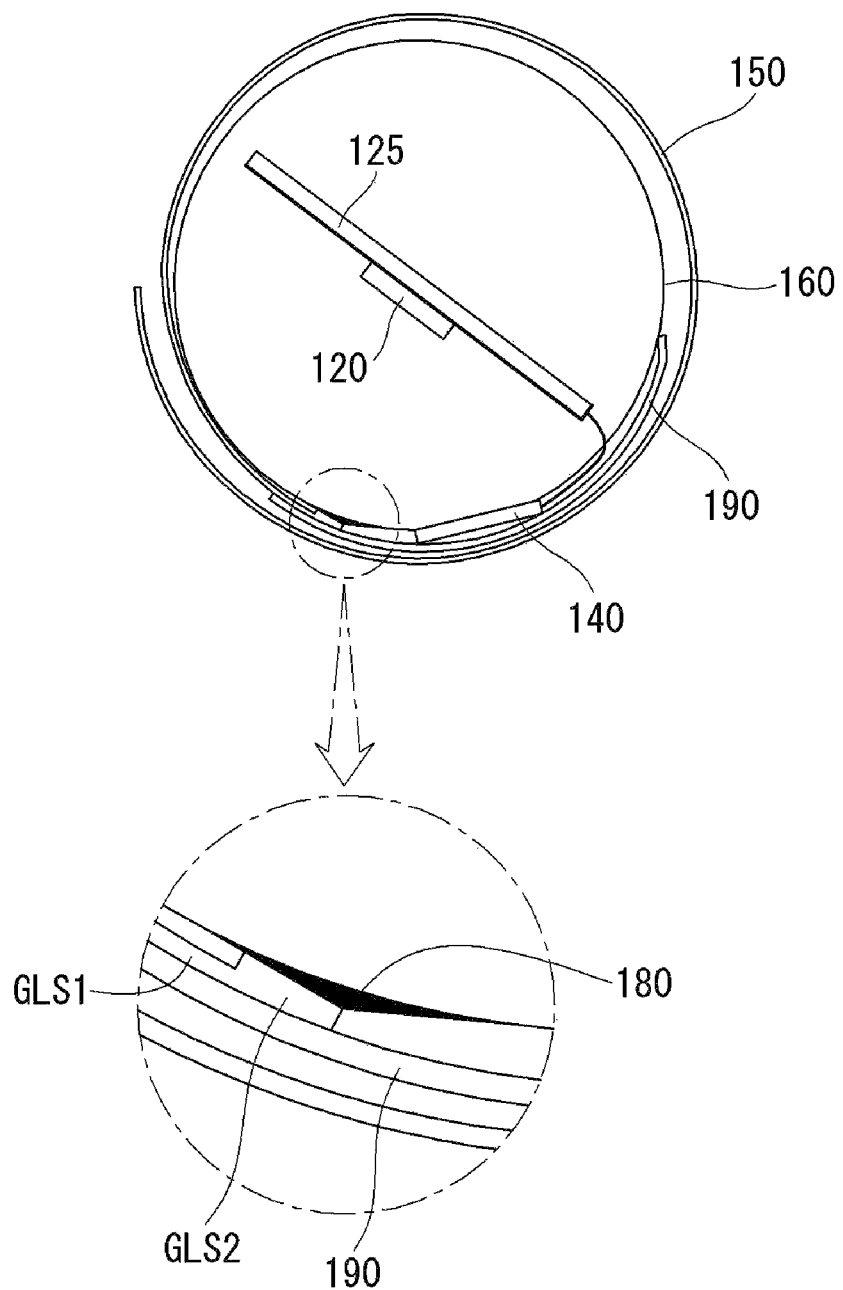
FIG. 22 is a cross-sectional view illustrating a rollable flexible display device according to the fifth embodiment of the present disclosure.

FIG. 11 is a cross-sectional view illustrating a rollable flexible display device according to a comparative, experimental example and FIGS. 12 through 14 are cross-sectional views illustrating a rollable flexible display device according to the first embodiment of the present disclosure. FIGS. 15 through 17 are cross-sectional views illustrating a rollable flexible display device according to the second embodiment of the present disclosure, FIGS. 18 through 20 are cross-sectional views illustrating a rollable flexible display device according to the third embodiment of the present disclosure, FIG. 21 is a cross-sectional view illustrating a rollable flexible display device according to the fourth embodiment of the present disclosure, and FIG. 22 is a cross-sectional view illustrating a rollable flexible display device according to the fifth embodiment of the present disclosure.

Experimental Example

As illustrated in FIG. 11, a panel roller unit 160 is designed to have a circular (cylindrical) shape. A control board 125 on which a timing controller 120, or the like, is mounted is installed within the panel roller unit 160. A source board 145 on which a display panel 150 and a data driver 140 are mounted is installed outside of the panel roller unit 160.

In the experimental example, a connection member, for example, the source board 145, rather than the display panel 150, starts to be rolled by the panel roller unit 160. In this case, since an internal surface and an external surface of the panel roller unit 160 have a circular shape, there may be no mechanical problem in a state in which the display panel 150 is unrolled as illustrated in (a) of FIG. 11. However, a mechanical problem may occur in a state in which the display panel 150 is rolled as illustrated in (b) of FIG. 11.

The display panel 150 may be rollable, but the data driver 140, or the like, mounted on the source board 145 may not be bent or rolled. That is, the display panel 150 may be rollable, but the member, such as the connection member, or the like, present between the display panel 150 and the panel roller unit 160 may not be rollable. As illustrated in (b) of FIG. 11, in an unrollable region, a portion of the source board 145 (or a flexible printed circuit board (FPCB)) may come off due to the data driver 140. On this account, as the number of times that the display panel 150 is rolled and unrolled increases, the probability that the data driver 140 or the pad part, or the like, of the display panel 150 connected thereto is cracked or damaged also increases.

In order to address such a problem, if the connection member is bent as much as the display panel 150, the connection member itself may be damaged, or if the shape of the connection member is changed to a different form, the manufacturing cost may increase.

First Embodiment

As illustrated in FIGS. 12 through 14, a panel roller unit 160 is designed to have a circular (cylindrical) shape. A control board 125 on which a timing controller 120, or the like, is mounted is fixedly installed within the panel roller unit 160. A source board 145 on which a display panel 150 and a data driver 140 are mounted is installed outside of the panel roller unit 160.

In the first embodiment, the connection member, for example, the source board 145, rather than the display panel 150, starts to be rolled by the panel roller unit 160. In order to address the problem of the experimental example, a depressed portion 165 is provided on an external surface of the panel roller unit 160. Thus, the panel roller unit 160 has a region forming a curved surface and a region forming a planar surface.

Since the depressed portion 165 formed by depressing the external surface of the panel roller unit 160 inwardly is provided, a mechanical problem as discussed in the experimental example may not occur even in a state in which the display panel 150 is rolled as illustrated in FIG. 13, as well as in a state in which the display panel 150 is unrolled as illustrated in FIG. 12.

The depressed portion 165 provided on the external surface of the panel roller unit 160 serves as a space accommodating the data driver 140 present between the display panel 150 and the panel roller unit 160. A position and a size (which may also be interpreted as having a meaning of a width and a depth, respectively) of the depressed portion 165 may correspond to a position and a size of the data driver 140. The size of the depressed portion 165 may be greater than that of the data driver 140. As illustrated in FIGS. 12-14, both side walls of the depressed portion 165 are gently sloped to safely accommodate and receive the data driver 140.

As illustrated in FIG. 14, a buffer member 166 may be attached to a surface of the depressed portion 165 in order to absorb a frictional contact or impact between the depressed portion 165 and the data driver 140. Also, corners of the depressed portion 165 may be processed to be rounded. The rounded portion may serve to reduce or prevent damages such as a scratch, or the like, that may be generated in the data driver 140 or the non-etched region GLS2 when the display panel 150 is loosely or tightly rolled on the panel roller unit 160.

Second Embodiment

As illustrated in FIGS. 15 through 17, a panel roller unit 160 is designed to have a circular (cylindrical) shape. A control board 125 on which a timing controller 120, or the like, is mounted is fixedly installed within the panel roller unit 160. A source board 145 on which a display panel 150 and a data driver 140 are mounted is installed outside of the panel roller unit 160.

In the second embodiment, the connection member, for example, the source board 145, rather than the display panel 150, starts to be rolled by the panel roller unit 160. In order to address the problem of the experimental example, a depressed portion 165 is provided on an external surface of the panel roller unit 160. Thus, the panel roller unit 160 has a region forming a curved surface and a region forming a planar surface.

Since the depressed portion 165 formed by depressing the external surface of the panel roller unit 160 inwardly is provided, a mechanical problem as discussed in the experimental example may not occur even in a state in which the display panel 150 is rolled as illustrated in FIG. 16, as well as in a state in which the display panel 150 is unrolled as illustrated in FIG. 15.

The depressed portion 165 provided on the external surface of the panel roller unit 160 serves as a space accommodating the data driver 140 and the non-etched region GSL2 of the display panel 150 present between the display panel 150 and the panel roller unit 160. A position of the depressed portion 165 may correspond to positions of the data driver 140 and the non-etched region GLS2 of the display panel 150, and a size of the depressed portion 165 may correspond to the sum of a size of the data driver 140 and a size of the non-etched region GLS2 of the display panel 150. The size of the depressed portion 165 may be greater than the sum of the size of the data driver 140 and the size of the non-etched region GLS2 of the display panel 150. As illustrated in in FIGS. 15-17, both side walls of the depressed portion 165 may be gently sloped to safely accommodate and receive the data driver 140 and the non-etched region GLS2 of the display panel 150.

As illustrated in FIG. 17, a buffer member 166 may be attached to a surface of the depressed portion 165 in order to absorb a frictional contact or impact between the depressed portion 165 and the data driver 140 and the non-etched region GLS2 of the display panel 150. Also, corners of the depressed portion 165 may be processed to be rounded. The rounded portion may serve to reduce or prevent damages such as a scratch, or the like, that may be generated in the data driver 140 or the non-etched region GLS2 when the display panel 150 is loosely or tightly rolled on the panel roller unit 160.

Third Embodiment

As illustrated in FIGS. 18 through 20, a panel roller unit 160 is designed to have a circular (cylindrical) shape. A control board 125 on which a timing controller 120, or the like, is mounted is fixedly installed within the panel roller unit 160. A source board 145 on which a display panel 150 and a data driver 140 are mounted is installed outside of the panel roller unit 160.

In the third embodiment, the connection member, for example, the source board 145, rather than the display panel 150, starts to be rolled by the panel roller unit 160. In order to address the problem of the experimental example, first and second depressed portions 165 and 167 are provided on an external surface of the panel roller unit 160. Thus, the panel roller unit 160 has a region forming a curved surface and a region forming a planar surface.

Since the first and second depressed portion 165 and 167 formed by depressing the external surface of the panel roller unit 160 inwardly are provided, a mechanical problem as discussed in the experimental example may not occur even in a state in which the display panel 150 is rolled as illustrated in FIG. 19, as well as in a state in which the display panel 150 is unrolled as illustrated in FIG. 18.

The first and second depressed portions 165 and 167 provided on the external surface of the panel roller unit 160 serve as spaces respectively accommodating the data driver 140 and the non-etched region GSL2 of the display panel 150 present between the display panel 150 and the panel roller unit 160. A position and a size of the first depressed portion 165 may correspond to those of the data driver 140. The size of the first depressed portion 165 may be greater than that of the data driver 140. A position and a size of the second depressed portion 167 correspond to the non-etched region GLS2 of the display panel 150. The size of the second depressed portion 167 may be greater than that of the non-etched region GLS2 of the display panel 150. As illustrated in FIGS. 18-20, both side walls of the first and second depressed portions 165 and 167 may be gently sloped to safely accommodate and receive the data driver 140 and the non-etched region GLS2 of the display panel 150, respectively.

As illustrated in FIG. 20, first and second buffer members 166 and 168 may be respectively attached to surfaces of the first and second depressed portions 165 and 167 in order to absorb a frictional contact or impact between the first depressed portion 165 and the data driver 140 and between the second depressed portion 167 and the non-etched region GLS2 of the display panel 150. Also, corners of the first and second depressed portions 165 and 167 may be processed to be rounded. The rounded portion may serve to reduce or prevent damages such as a scratch, or the like, that may be generated in the data driver 140 or the non-etched region GLS2 when the display panel 150 is loosely or tightly rolled on the panel roller unit 160.

In the first to third embodiments, one depressed portion 165 or two depressed portions 165 and 167 are provided by way of example, but N (N is an integer equal to or greater than 2) number of depressed portions may also be provided. Also, in the first to third embodiments, the depressed portion 165 (and/or the depressed portion 167) is formed on the panel roller unit 160 by way of example, but a similar effect can be achieved in the fourth embodiment described hereinafter.

Fourth Embodiment

As illustrated in FIG. 21, a panel roller unit 160 is configured to have a region 160a forming a curved surface and a region 160b forming a planar surface. In the panel roller unit 160, a portion corresponding to a data driver 140 or corresponding to the data driver 140 and the non-etched region GLS2 of a display panel 150 is formed to have a planar shape (or a planar portion).

A casting or injection-molding process can be used to manufacture the panel roller unit 160 that has the region 160a forming a curved surface and the region 160 forming a planar surface. Alternatively, the panel roller unit 160 may be manufactured through a method of polishing or etching only the region 160b forming a planar surface. However, the present disclosure is not limited thereto.

Since the panel roller unit 160 has a planar portion, a stress, which may be generated in a portion of the panel roller unit 160 with which a planar structure, rather than a curved structure, comes into contact, may be alleviated to reduce or prevent a damage to a component or a device.

Fifth Embodiment

As illustrated in FIG. 22, a panel roller unit 160 may be configured to have a region forming a curved surface and a region forming a planar surface. In the panel roller unit 160, a portion corresponding to the non-etched region GLS2 of the display panel 150 may have a planar shape by an auxiliary bar 180.

The auxiliary bar 180 may form a planar portion forming a plane in the panel roller unit 160 to alleviate a stress, which may be generated in a portion of the panel roller unit 160 with which a planar structure, rather than a curved structure, comes into contact, thus preventing damage to a component or a device.

The auxiliary bar 180 may be selectively formed of stainless steel or rubber which is thin and has an elasticity or restoring force. The auxiliary bar 180 may have a bar shape extending in a length direction of the non-etched region GLS2 of the display panel 150. A tape or an adhesive material may be selected as the auxiliary bar 180, but the present disclosure is not limited thereto.

In FIG. 22, reference numeral 190 denotes an auxiliary sheet attached to a rear surface of the display panel 150. The auxiliary sheet 180 serves to alleviate a mechanical stress that may be generated in a partial region when the display panel 150 is rolled in a roller form.

As described above, an embodiment of the present disclosure provides a rollable flexible display device, which can reduce or prevent mechanical damages such as a crack, when the display panel is deformed such as being rolled and subsequently unrolled in a roller form. Also, the rollable flexible display device may effectively absorb, disperse or alleviate a tensile stress that may be generated when the display panel is rolled and subsequently unrolled. In addition, the display panel may be manufactured such that a portion thereof prone to impact can be protected. Moreover, a member such as a device or a structure present between the display panel and the panel roller unit can be protected from a frictional contact or impact.

It will be apparent to those skilled in the art that various modifications and variation can be made in the present invention without departing from the concepts and scope of the invention. Thus, it is intended that the present invention cover the modifications and variations of this invention provided they come within the scope of the appended claims and their equivalents.

What is claimed is:

1. A rollable flexible display device comprising:
a display panel configured to display an image;
a source board connected to the display panel and allowing a driver for providing a signal to the display panel to be mounted thereon; and
a panel roller unit configured to provide a mechanical structure for rolling the display panel and the source board along an outer circumferential surface thereof,
wherein the panel roller unit has a region forming a curved surface and a region forming a planar surface, and
wherein the region forming the planar surface corresponds to the driver, and a size of the region forming the planar surface is equal to or greater than a size of the driver.

2. The rollable flexible display device of claim 1, wherein the panel roller unit has a depressed portion in the region forming the planar surface.

3. The rollable flexible display device of claim 2, wherein the depressed portion has a buffer member attached to a surface thereof.

4. The rollable flexible display device of claim 2, wherein a corner region of the depressed portion is rounded.

5. The rollable flexible display device of claim 1, wherein the display panel comprises a first substrate, an intermediate layer having a display area including a plurality of pixels, and a second substrate attached to the first substrate so as to be sealed, and wherein the second substrate is formed of a metal.

6. The rollable flexible display device of claim 5, wherein the first substrate has a non-etched region and an etched region having a thickness smaller than that of the non-etched region.

7. The rollable flexible display device of claim 6, wherein the non-etched region is a region in which a pad part connecting the display panel and an external board is positioned.

8. The rollable flexible display device of claim 6, wherein the panel roller unit comprises:
a first depressed portion in the region forming the planar surface and corresponding to the driver; and
a second depressed portion corresponding to the non-etched region.

9. The rollable flexible display device of claim 6, wherein a thickness of the non-etched region ranges from 0.1 mm to 0.2 mm and a thickness of the etched region ranges from 0.01 mm to 0.2 mm.

10. The rollable flexible display device of claim 5, wherein the second substrate has a protrusion protruding outwardly with respect to the first substrate.

11. The rollable flexible display device of claim 5, wherein the first substrate has a thickness ranging from 0.01 mm to 0.2 mm.

12. The rollable flexible display device of claim 11, wherein the first substrate formed of glass has a thickness ranging from 0.01 mm to 0.1 mm.

13. The rollable flexible display device of claim 5, wherein the second substrate has a thickness ranging from 0.01 mm to 0.2 mm.

14. The rollable flexible display device of claim 1, further comprising:
a receiving unit configured to receive the panel roller and the display panel.

15. The rollable flexible display device of claim 14, wherein the receiving unit comprises a driving device to rotate the panel roller electrically.

16. The rollable flexible display device of claim 1, wherein the display panel comprises a first substrate and a second substrate attached to the first substrate so as to be sealed, and
wherein the first substrate comprises a first portion and a second portion a width of which is thicker than that of the first portion.

17. The rollable flexible display device of claim 1, further comprising: an auxiliary sheet configured to connect the display panel and the panel roller unit.

* * * * *